United States Patent

Akimoto

(10) Patent No.: US 7,976,734 B2
(45) Date of Patent: *Jul. 12, 2011

(54) SOLAR CELL ELECTRODES

(75) Inventor: Hideki Akimoto, Kawaskaki Kanagawa (JP)

(73) Assignee: E.I. Du Pont De Nemours and Company, Wilmington, DE (US)

( * ) Notice: Subject to any disclaimer, the term of this patent is extended or adjusted under 35 U.S.C. 154(b) by 305 days.

This patent is subject to a terminal disclaimer.

(21) Appl. No.: 12/207,652

(22) Filed: Sep. 10, 2008

(65) Prior Publication Data

US 2010/0059106 A1 Mar. 11, 2010

(51) Int. Cl.
*H01B 1/22* (2006.01)
*H01L 31/0224* (2006.01)

(52) U.S. Cl. ........................ 252/514; 136/256

(58) Field of Classification Search .......... 252/514; 136/252, 256; 427/96, 125
See application file for complete search history.

(56) References Cited

U.S. PATENT DOCUMENTS

| 4,153,907 | A | * | 5/1979 | Kofron | 257/461 |
| 4,486,232 | A | * | 12/1984 | Nakatani et al. | 75/252 |
| 5,428,249 | A | * | 6/1995 | Sawayama et al. | 257/746 |
| 7,494,607 | B2 | * | 2/2009 | Wang et al. | 252/514 |
| 2006/0231803 | A1 | * | 10/2006 | Wang et al. | 252/500 |

FOREIGN PATENT DOCUMENTS

| EP | 11713091 A2 | 10/2006 |
| EP | 1801891 A1 | 6/2007 |
| JP | 2005-243500 A | 9/2005 |
| JP | 2006-093433 A | 4/2006 |

OTHER PUBLICATIONS

Cotter et al., "P-Type Versus n-Type Silicon Wafers: Prospects for High Efficiency Commercial Silicon Solar Cells", IEEE Transactions on Electron Devices, vol. 53, No. 8, 2006, pp. 1893-1901.
Geerligs et al., "N-Type Solar Grade Silicon for Efficient P+N Solar Cells: Overview and Main Results of the EC Nesssi Project", 21st European Photovoltaic Solar Energy Conference and Exhibition, Germany, 2006.
International Search Report for International Application No. PCT. US2009/056345 Dated Jan. 11, 2010.

* cited by examiner

*Primary Examiner* — Mark Kopec

(57) ABSTRACT

This invention describes a p-type electrode useful in producing a solar cell.

4 Claims, 3 Drawing Sheets

Wafer: 20mm sq.

Electrode: 6mm diameter

Distance: 1mm $R_{(measure)} = 2 \times R_{(contact)} + R_{(Si\,Wafer)}$ $R_{(Si\,Wafer)} =$ Constant

SOLAR CELL ELECTRODES

FIELD OF THE INVENTION

This invention relates to an electrode used in a solar cell.

TECHNICAL BACKGROUND OF THE INVENTION

An electrode for a crystal solar cell is required to have low electrical resistance to facilitate improved efficiency. In the case of a contact between a metal and semiconductor, in such structures, a Schottky barrier is known to be formed that causes a considerable increase in contact resistance. Since the electrical resistance of an electrode is the sum of the conductor resistance and the contact resistance, in addition to lowering the conductor resistance of an electrode, it is also necessary to reduce the contact resistance with the conductor.

As shown in FIG. 1, a conventional silicon solar cell is a, so called, P-type base solar cell 105 which has a n-type diffusion layer ($n^+$ layer) 102 on a p-type silicon substrate 101, an anti-reflection coating and a n-type electrode 104 on the p-type diffusion layer. The n-type electrode 104 is formed in line and called bus or finger electrode. In the backside, a p-type electrode consists of aluminum layer 106 and silver layer 107.

FIG. 2 shows an N-type base solar cell 205 that has been on tested for practical use. The N-type base solar cell 205 has a $p^+$ layer 202 on a p-type silicon substrate 201, an anti-reflection coating 203 and a p-type electrode 204 on the $p^+$ layer 202. In the backside, an n-type electrode 206 is formed.

J. E. Cotter et al. says that n-type silicon wafers are more tolerant to chemical and crystallographic defects than p-type silicon wafers (P-type versus n-type Silicon Wafers: Prospects for hi-efficiency commercial silicon solar cell; IEEE transactions on electron devices, VOL.53, NO.8, August 2006). L. J. Geerligs, et al. says that high and homogeneous carrier lifetime was observed in the n-type silicon wafer (N-TYPE SOLAR GRADE SILICON FOR EFFICIENT P+N SOLAR CELLS: OVERVIEW AND MAIN RESULTS OF THE EC NESSI PROJECT; European photovoltaic solar energy conference and exhibition 4-8$^{th}$ September 2006).

Aluminum paste which has both a relatively low conductor resistance and contact resistance has been used for forming a $p^+$ electrode in both N-type and P-type base solar cells. However the lower conductor resistance and contact resistance are now required. The problem is that Silver, which has lower conductor resistance, is hardly ever used because it gets high contact resistance on the contact with $p^+$ layer. To solve the problem, JP2006-93433 discloses an electrode which is formed on a p-type conductive layer by using a conductive paste which comprises silver powder, an organic vehicle, glass frit and at least one composition selected from the group consisting of boron powder, an inorganic boron compound, and an organic boron compound.

It is desirable to provide a p-type electrode which has lowered contact resistance as well as lowered conductor resistance.

BRIEF SUMMARY OF THE INVENTION

The p-type electrode on $p^+$ layer of solar cell of this present invention comprises, prior to firing, (a) Electrically conductive particles containing silver particle and added particle selected from the group consisting of (i) metal particles selected from a group consisting of Mo, Tc, Ru, Rh, Pd, W, Re, Os, Ir and Pt particles, (ii) a metal alloy containing of the metal particles, and (iii) silver particles coating with the metal selected from the group consisting of Mo, Tc, Ru, Rh, Pd, W, Re, Os, Ir and Pt, (iv) the metal particles of supported by carbon particles, (b) Glass frit, and (c) A resin binder.

The above mentioned metal particles are preferably selected from a group consisting of Ru, Rh, Pd, W, and Pt particles. The above mentioned metal particles are more preferably Ru, Pd or Pt. The p-type electrode is preferably made from a fired conductive paste which is comprised of 40 to 90 wt % of the silver particles and 0.01 to 10 wt % of the added particle based on the weight of the paste.

In another aspect of this present invention, a method for producing a p-type electrode comprises steps of (1) applying a paste comprising (a) Electrically conductive particles containing silver particle and added particle selected from the group consisting of (i) metal particles selected from a group consisting of Mo, Tc, Ru, Rh, Pd, W, Re, Os, Ir and Pt particles, (ii) a metal alloy containing the metal particles, and (iii) silver particles coating with the metal selected from the group consisting of Mo, Tc, Ru, Rh, Pd, W, Re, Os, Ir and Pt, (iv) the metal particles supported by carbon particles, onto $p^+$ layer of the light receiving side of the N-type base solar cell substrate (b) Glass frit, and (c) A resin binder, and (2) firing the applied paste. The method for producing a p-type electrode described above preferably further comprises a step of firing at 450 to 900° C.

Another aspect of this present invention is a method for producing a p-type electrode comprising the steps of (1) applying a paste comprising (a) electrically conductive particles containing silver particle and added particles selected from the group consisting of (i) metal particles selected from the group consisting of Mo, Tc, Ru, Rh, Pd, W, Re, Os, Ir and Pt particles, (ii) a metal alloy containing the metal particles, and (iii) silver particles coating with the metal selected from the group consisting of Mo, Tc, Ru, Rh, Pd, W, Re, Os, Ir and Pt, (iv) the metal particles of (i) supported by carbon particles, onto $p^+$ layer of the light receiving side of the P-type base solar cell substrate (b) Glass frit, and (c) A resin binder, and (2) Firing the applied paste. The method for producing a p-type electrode described above mentioned preferably further comprises a step of firing at 450 to 900° C.

Also disclosed is a composition useful for making a p-type electrode on $p^+$ layer of solar cell comprising, prior to firing;
 (a) Electrically conductive particles containing silver particle and added particle selected from the group consisting of (i) metal particles selected from the group consisting of Mo, Tc, Ru, Rh, Pd, W, Re, Os, Ir and Pt particles, (ii) a metal alloy containing the metal particles, and (iii) silver particles coating with the metal selected from the group consisting of Mo, Tc, Ru, Rh, Pd, W, Re, Os, Ir and Pt, (iv) the metal particles of (i) supported by carbon particles,
 (b) Glass frit, and
 (c) A resin binder.

Electrodes of the present invention have low contact resistance with $p^+$ layer in the silicon solar cell. Electrodes of the present invention can be formed on both the front side (light receiving side) of the N-type base solar cell and the back side of the P-type base solar cell.

DETAILED DESCRIPTION OF THE INVENTION

Figure 1A:
FIGS. 1(A) to (E) are drawings for explaining a P-type base solar cell production process.

A first embodiment of the present invention relates to a silicon solar cell, especially to a p-type electrode formed on a $p^+$ layer of the N-type and P-type solar cell.

Addition of other components and particularly the addition of precious metals such as Pd or Pt has been avoided for conventional crystalline solar cell uses because they might increase price and lower electrical conductivity. The contact resistance between $p^+$ layer and p-type electrode decreases by putting proper metal powder in p-type electrode. A preferred paste is obtained, in the case of a back contact-type solar cell, by lowering the contact resistance by the addition of a predetermined amount of metal to the paste. The conductive paste to make p-type electrode of this invention is explained in detail in the following discussion:

1. Silver powder

Silver (Ag) particles are used as an electrically conductive metal. The silver particle may be in the shape of flakes, spheres or they may be amorphous. Although there are no particular limitations on the particle diameter of the silver particle from the viewpoint of technical effects in the case of being used as an ordinary electrically conductive paste, particle diameter has an effect on the sintering characteristics of the silver, for example, silver particle having a large particle diameter are sintered at a slower rate than silver particle having a small particle diameter. Thus, although the particle diameter ($d_{50}$) is preferably within the range of 0.1 μm to 10.0 μm, the particle diameter of the silver particle actually used is determined according to the firing profile. Moreover, it is necessary that the silver particle having a particle diameter suited for methods for applying an electrically conductive paste (for example, screen printing). In the present invention, two or more types of silver particle having different particle diameters may be used as a mixture. Normally, the silver preferably has a high purity (greater than 99%). However, substances of lower purity can be used depending on the electrical requirements of the electrode pattern. Although there are no particular limitations on the silver content provided it is an amount that allows the object of the present invention to be achieved, in the case of silver particle, the silver content is preferably 40% to 90% by weight based on the weight of the paste.

2. Added Particles

In the present invention, 3d or 4d transition metals belonging to groups 6 to 11 of the periodic table are used in addition to the silver particle. Namely, metal particles selected from the group consisting of Mo (molybdenum), Tc (technetium), Ru (ruthenium), Rh (rhodium), Pd (palladium), W (tungsten), Re (rhenium), Os (osmium), Ir (iridium) and Pt (platinum) are added. Ruthenium, palladium or platinum are preferable from the viewpoint of lowering contact resistance. In the present invention, alloy particles containing the above-mentioned metals or particles loaded with the above-mentioned metal particles can also be used. Examples of alloys containing the metal particles (also referred to as added particles in the present description) include Ag/Pd alloy and Ni/Mo alloy. The added particles may be in the shape of flakes, spheres or they may be amorphous. Although there are no particular limitations on the particle diameter of the added particles, from the viewpoint of technical effects in the case of being used as an ordinary electrically conductive paste, particle diameter has an effect on the sintering characteristics of the silver For example, added particles having a large diameter are sintered at a slower rate than silver particle having a small particle diameter. Thus, although the particle diameter ($d_{50}$) is preferably within the range of 0.1 to 10.0 μm, the particle diameter of the added particles actually used is determined according to the firing profile. Moreover, it is necessary that the added particles having a particle diameter suited for methods for applying an conductive paste (for example, screen printing). In the present invention, two or more types of silver particle having different particle diameters may be used as a mixture. In the present invention, the above-mentioned metal particles supported by carbon particles can preferably also be used. Since metal particles with small diameter have strong cohesion, the amount of metal particles can be reduced by being supported by carbon particles which has relatively large diameter. The carbon particles used in this invention is a carbon which is made from organic precursor heat-treated in the inert atmosphere, for example, Ketchen black, carbon black, activated carbon, coke, graphite. The particle diameter ($d_{50}$) of the carbon particles is preferably within the range of 1.0 to 10.0 μm. The particle diameter ($d_{50}$) of the metal particles supported by the carbon particles is preferably within the range of 0.01 to 0.2 μm. The content of the metal particles is preferably within the range of 1 to 10 wt % based on the total weight of the carbon particles.

The amount of the added particles is in the range of 0.01 to 10% by weight and any ranges contained therein, and preferably 0.1% to 5% by weight based on the weight of the paste. If the amount of added particles is excessively low, positive effects are not obtained. In addition, if the amount of added particles is excessively high, conductor resistance increases, sinterability decreases and costs increase. And conductive particles may preferably be silver particles coated with molybdenum, Technetium, Ruthenium, Rhodium, Palladium, Tungsten, Rhenium, Osmium, Iridium and Platinum. The coating thickness is preferably more than 0.1 μm.

3. Glass Frit

The electrically conductive paste of the present invention preferably contains an inorganic binder in the form of glass frit. Since the chemical composition of the glass frit is not important in the present invention, any glass frit can be used provided it is a glass frit used in electrically conductive pastes for electronic materials. For example, lead borosilicate glass is used preferably. Lead borosilicate glass is a superior material in the present invention from the standpoint of both the range of the softening point and glass adhesion. In addition, lead-free glass, such as a bismuth silicate lead-free glass, can also be used.

Although there are no particular limitations on the content of the inorganic binder in the form of the glass frit provided it is an amount that allows the object of the present invention to be achieved, it is 0.5% to 15.0% by weight and preferably 1.0% to 10.0% by weight based on the weight of the paste. If the amount of the inorganic binder is less than 0.5% by weight, adhesive strength may become inadequate. If the amount of the inorganic binder exceeds 15.0% by weight, problems may be caused in the subsequent soldering step due to floating glass and so on. In addition, the resistance value as a conductor also increases.

4. Resin Binder

The electrically conductive paste to make the electrode of the present invention contains a resin binder. In the present invention, any selected resin binder can be used. As a kind of organic resin, for example, an epoxy resin, polyester resin, urethane modified polyester resin, epoxy modified polyester resin, Various modified polyester resin, such as acrylic modification polyester resin, polyether urethane resin and polycarbonate urethane resin may be used. Polyolefin system resins, such as polyethylene, polypropylene, an ethylene-vinyl acetate copolymer, and mallein-ized polyolefine, modified cellulose, such as a polyvinyl chloride acetate copolymer, an epoxy resin, phenol resin, an acrylic resin, polyamidoimide, a ethyl cellulose, a nitrocellulose, cellulose acetate butylate (CAB), and cellulose acetate propionate (CAP), may also be used. The ethyl cellulose with a good solvent solubility is preferably used in this present invention. The content of the resin binder is preferably 10% to 50% by weight based on the weight of the paste.

5. Solvent

In the present invention, a solvent can be additionally used as a viscosity adjuster, as necessary. Any resin binder can be used. Examples of such solvents include esters solvent, ketone solvent, ether esters solvent, chlorinated solvent, alcohols solvent, ether type solvent and hydrocarbon solvent. In case of screen printing is taken, high-boiling solvents such as ethyl carbitol acetate, butyl cellosolve acetate, isophorone, cyclohexanone, γ-butyrolactone, benzyl alcohol, Ng-methyl-2-pyrolidone, tetrahydronaphthalene are favorably used.

6. Additives

A thickener and/or stabilizer and/or other typical additives may be or may not be added to the electrically conductive paste to make the electrode of the present invention. Examples of other typical additives that can be added include dispersants and viscosity adjusters. The amount of additive is determined dependent upon the characteristics of the ultimately required electrically conductive paste. The amount of additive can be suitably determined by a person with ordinary skill in the art. Furthermore, a plurality of types of additives may also be added. As is explained below, the electrically conductive paste of the present invention has a viscosity within a predetermined range. A viscosity adjuster can be added as necessary to impart a suitable viscosity to the electrically conductive paste. Although the amount of viscosity adjuster added changes dependent upon the viscosity of the ultimate electrically conductive paste, it can be suitably determined by a person with ordinary skill in the art.

The following provides an explanation of manufacturing p-type electrode of this present invention. The electrically conductive paste to make the p-type electrode of the present invention can be produced as a desired by mixing each of the above-mentioned components with a roll mixing mill or rotary mixer and the like. Although the electrically conductive paste of the present invention is preferably printed onto a desired site on the p$^+$ layer of a solar cell by screen printing, in the case of being printed by this type of printing, the paste preferably has a predetermined viscosity range. The viscosity of the electrically conductive paste of the present invention is preferably 50 PaS to 350 PaS in the case of using a #14 spindle with a Brookfield HBT Viscometer and measuring using a utility cup at 10 rpm and 25° C. Although the amount of viscosity adjuster added changes dependent upon the viscosity of the ultimate electrically conductive paste, it can be suitably determined by a person with ordinary skill in the art. The screen printed paste is dried for 3 to 10 minutes under around 150° C. The dried paste is sintered at temperature of 450 to 900° C., preferably 450 to 700° C., for 10 to 60 seconds. Sintering at a low temperature offers the advantages of reducing damage to P-N junctions, decreasing susceptibility to the occurrence of destruction caused by thermal damage and lowering costs.

The following provides an explanation of a silicon type solar cell using the p-type electrode of the present invention and an explanation of a production process of the silicon type solar cell using the example of a solar cell having the structure shown in FIG. 1.

FIG. 1A shows a p-type silicon substrate 101.

Figure 1B:
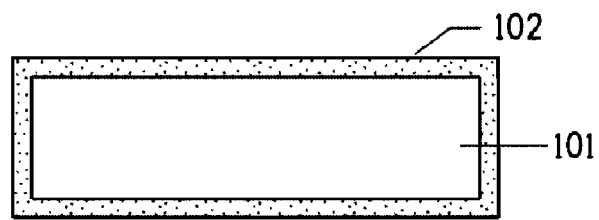

In FIG. 1B, an n-type diffusion layer 102, of the reverse conductivity type is formed by the thermal diffusion of phosphorus (P) or the like. Phosphorus oxychloride ($POCl_3$) is commonly used as the phosphorus diffusion source. In the absence of any particular modification, the diffusion layer 102 is formed over the entire surface of the silicon substrate 101. This diffusion layer typically has a sheet resistivity on the order of several tens of ohms per square (Ω/m2), and a thickness of about 0.3 to 0.5 μm.

Figure 1C:
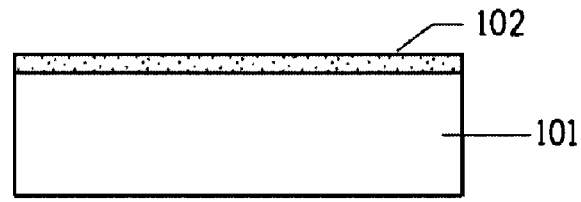

After protecting one surface of this diffusion layer with a resist or the like, as shown in FIG. 1C, the n-type diffusion layer 102 is removed from most surfaces by etching so that it remains only on one main surface. The resist is then removed using an organic solvent or the like.

Figure 1D:
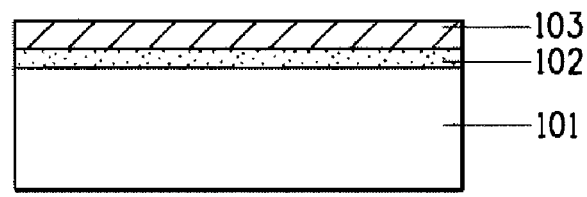

Next, an anti-reflection coating 103 is formed on the n-type diffusion layer 102 to a thickness of typically about 700 to 900 Å in the manner shown in FIG. 1D by a process such as plasma chemical vapor deposition (CVD).

Figure 1E:
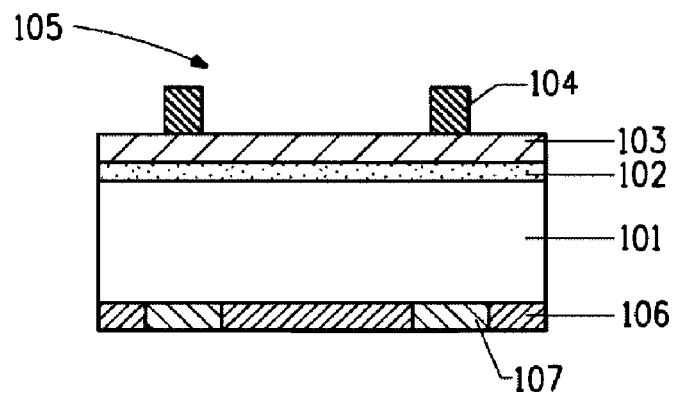

As shown in FIG. 1E, conductive paste for the front electrode 105 is screen printed then dried over the silicon nitride film 103. The conductive paste for the front electrode may comprise any kind of metal such as Al Ag, Au, Pt, Cu, Ni, Pd and their alloy that could get electricity from the p-type substrate 101. The conductive paste of the present invention is then screen printed as a backside electrode 106 and successively dried on the backside of the substrate 101. The backside p-type electrode consists of aluminum layer 106 and silver layer 107. The back side conductive layers may be two layers which comprise different metals respectively. Firing is then carried out in an infrared furnace at a temperature range of approximately 700° C. to 975° C. for a period of from several minutes to several tens of minutes.

Figure 2A:
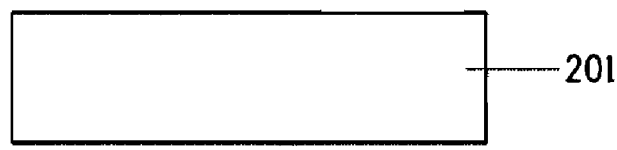
FIGS. 2(A) to (E) are drawings for explaining an N-type base solar cell production process.

FIG. 2A shows an n-type silicon substrate 201.

Figure 2B:

In FIG. 2B, a p-type diffusion layer 202 of the reverse conductivity type is formed by the thermal diffusion of boron (B) or the like. Boron tribromide (BBr3) is commonly used as the boron diffusion source. In the absence of any particular modification, the p-type diffusion layer 202 is formed over the entire surface of the n-type silicon substrate 201. This diffusion layer typically has a sheet resistivity on the order of several tens of ohms per square (Ω/m2), and a thickness of about 0.3 μm to 0.5 μm.

Figure 2C:
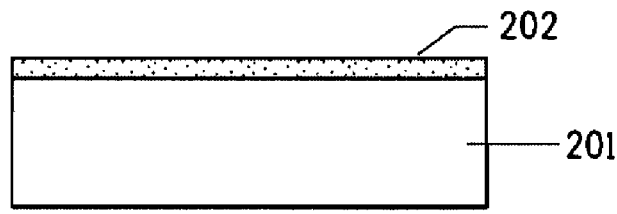

After protecting one surface of this diffusion layer with a resist or the like, as shown in FIG. 2C, the p-type diffusion layer 202 is removed from most surfaces by etching so that it remains only on one main surface. The resist is then removed using an organic solvent or the like.

Figure 2D:
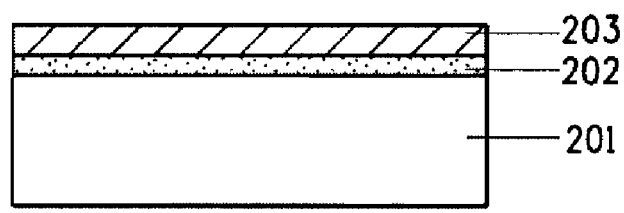

Next, an anti-reflection coating 203 is formed on the p-type diffusion layer 202 to a thickness of typically about 700 to 900 Å in the manner shown in FIG. 2D by a process such as plasma chemical vapor deposition (CVD).

Figure 2E:
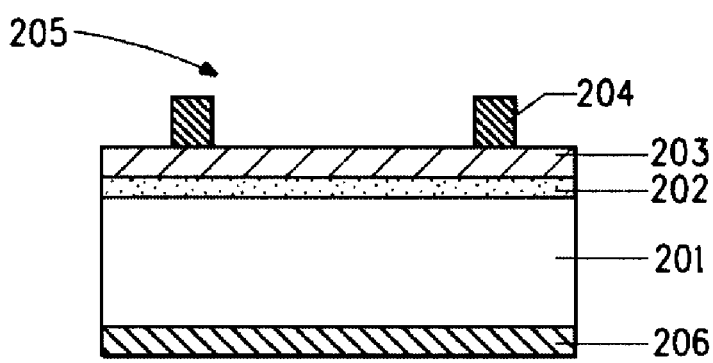

As shown in FIG. 2E, a conductive paste of the present invention is screen printed as a front electrode 205 then dried over the silicon nitride film 203. In addition, a backside conductive paste 206 is then screen printed and successively dried on the backside of the substrate 201. The backside conductive paste may comprise any kind of metal such as Ag, Au, Pt, Al, Cu, Ni, Pd and their alloy that could get electricity from the n-type silicon substrate 201. The conductive layer may two layers which comprise different metal respectively. Firing is then carried out in an infrared furnace at a temperature range of approximately 700° C. to 975° C. for a period of from several minutes to several tens of minutes.

Both of n-type base and p-type base solar cell, When a semiconductor, for example, is used as a photocatalyst and light having energy greater than the band gap energy of the semiconductor is irradiated, electrons in the valence band are photo-excited into the conduction band to generate free electrons in the conduction band, and, in contrast, positive holes are generated in the valence band. The more electrons reach to the electrode before recombination of those free electrons and positive holes called carrier, the more electric current is obtained. Therefore, recombination reduction is effective in raising solar cell's efficiency. With this reason, a semiconductor substrate where the said carrier is generated is preferably crystal silicon type with high resistance.

EXAMPLES

Although the following provides an explanation of the present invention through examples thereof, the present invention is not limited to these examples.

(I) Preparation of Silver Pastes

Silver pastes 1 and 2 to make p-type electrodes were produced to have the compositions shown in Table 1 using the materials indicated below.

(i) Silver Particle

Flaked silver particle [$d_{50}$ 2.7 μm (as determined with a laser scattering-type particle size distribution measuring apparatus)

(ii) Glass Frit

Leaded: Lead borosilicate glass frit
Components: $SiO_2/PbO/B_2O_3/ZnO$
Softening point: 440° C.
Lead-free: Lead-free bismuth glass frit
Components: $SiO_2/Al_2O_3/B_2O_3/ZnO/Bi_2O_3/SnO_2$
Softening point: 390° C.

(iii) Resin
Ethyl cellulose resin (Aqualon, Hercules)

(iv) Solvent

TABLE 1

| (Parts by weight) | Silver particle | Glass frit Leaded | Glass frit Lead-free | Resin | Terpineol Solvent | Total |
|---|---|---|---|---|---|---|
| Paste 1 | 70.30 | 5.25 | | 2.50 | 21.95 | 100.00 |
| Paste 2 | 70.30 | | 5.25 | 2.50 | 21.95 | 100.00 |

The silver particle, glass frit, resin and solvent were each weighed, mixed and kneaded with a three-roll kneader to obtain silver pastes.

(II) Preparation of Added Metal Pastes

Pastes A to I were prepared using the metal particles and metal-loaded particles of each of the metals (to be referred to as the added particles), resin and solvent shown in Table 2. The resin and solvent were the same as those used to prepare the silver paste described above.

TABLE 2

| (Parts by weight) | Type of added particles | Added particles (wt %) | Resin (wt %) | Solvent (wt %) | Total (wt %) |
|---|---|---|---|---|---|
| Paste A | Ni | 10.00 | 1.30 | 8.70 | 20 |
| Paste B | W | 10.00 | 1.30 | 8.70 | 20 |
| Paste C | Pd | 10.00 | 1.30 | 8.70 | 20 |
| Paste D | Ag/Pd alloy | 10.00 | 1.30 | 8.70 | 20 |

TABLE 2-continued

| (Parts by weight) | Type of added particles | Added particles (wt %) | Resin (wt %) | Solvent (wt %) | Total (wt %) |
|---|---|---|---|---|---|
| Paste E | Pt | 10.00 | 1.30 | 8.70 | 20 |
| Paste F | Au | 10.00 | 1.30 | 8.70 | 20 |
| Paste G | Ru | 10.00 | 1.30 | 8.70 | 20 |
| Paste H | Rh | 10.00 | 1.30 | 8.70 | 20 |
| Paste I | Pt-loaded graphite | 5.00 | 1.95 | 13.05 | 20 |

The metal particles, resin and solvent were each weighed, mixed and stirred for 2 minutes using a rotary mixer to obtain added metal pastes.

(III) Preparation of Electrically Conductive Pastes and samples.

The silver paste prepared in (I) above and the pastes A to I prepared in (II) above were mixed and stirred for 2 minutes with a rotary mixer. Pastes A to I were added to the silver paste so that the mixing ratio was 1% by weight of the added particles to the weight of the silver in the silver paste (although two types of electrically conductive pastes were prepared for the Pt-loaded graphite having mixing ratios of 1% by weight and 2% by weight). For example, a silver paste containing Pd metal was prepared by adding 0.142 parts by weight of paste C to paste 1 (10.00 parts by weight). The conductive paste was screen printed on a commercially available 4-inch single crystal silicon wafer (Mitsubishi Materials Corp., crystal axis (1.0.0), P-type conductivity) and dried for 5 minutes at 150° C. and sintered to obtain p-type electrode.

Sample Shape

Figure 3A:
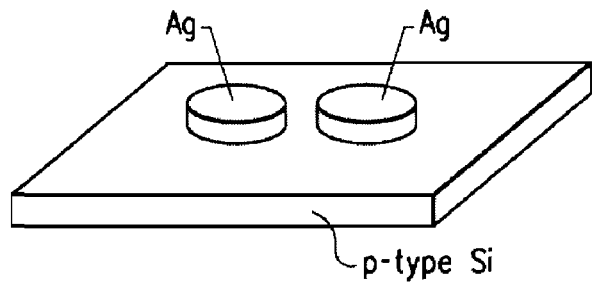
FIGS. 3(A) to (C) are drawings showing the shape of a sample for measuring the contact resistance of electrodes in examples.
Figure 3B:
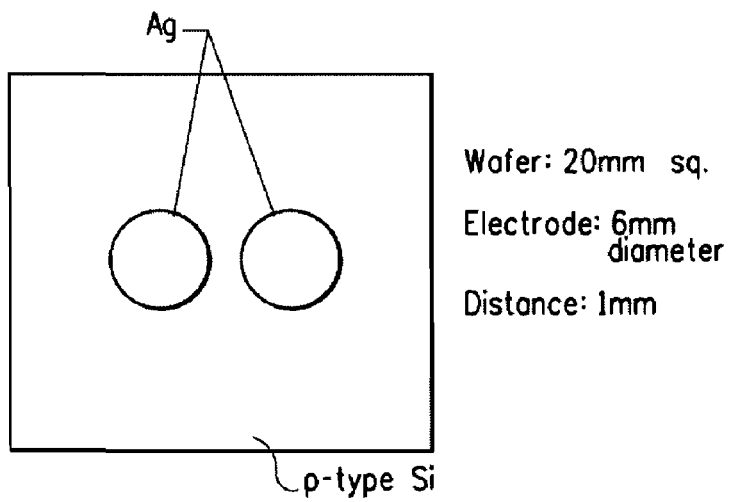

Samples were prepared by cutting the crystal silicon wafer on which the p-type electrode is. Circular patterns having a diameter of 6 mm were formed at an interval of 1 mm on a Si wafer cut to the shape of a square measuring 20 mm on a side (see FIG. 3(b))

Firing Conditions

The wafers were fired under the following conditions using an IR heating belt furnace.
Maximum set temperature: 600° C.
Belt speed: 370 cpm
Furnace temperature profile:
400° C. or higher: 18 seconds
500° C. or higher: 12 seconds (IV) Evaluation Method The resistance values (Ω) were measured for each of the p-type electrode samples shown in the FIG. 3(a) and (b) obtained by the described above method.

Resistance Value Measurement Conditions

Current and voltage characteristics between the sample electrodes formed under the conditions described above were measured with the HSV-100 Cyclic Voltanometry apparatus available from Hokuto Denko Corp. The average of inter-electrode resistance over an applied voltage range of 0.2 to 0.4 V was used as the resistance value.

Figure 3C:
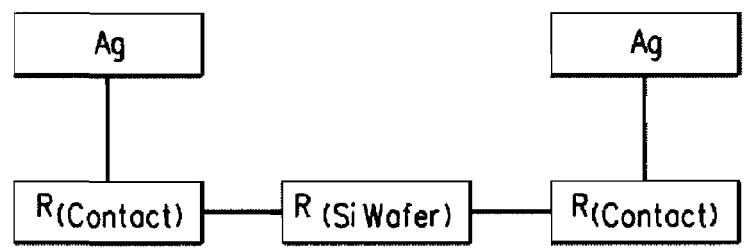

As shown in FIG. 3(c), since the resistance of the fabricated electrodes was small enough to be able to be ignored in terms of magnitude, the measured resistance values were taken to be the sum of the resistance value of the Si wafer and the contact resistance at the Si-Ag (electrode) interface. Since the resistance value of the Si wafer is constant, the magnitude of the measured resistance represents the magnitude of the contact resistance.

(V) Results

The results of measuring the resistance values of each of the p-type electrodes are shown in Table 3 (using paste 1 for the silver paste) and Table 4 (using paste 2 for the silver paste).

TABLE 3

Resistance Values and Evaluation of Electrically Conductive Pastes Using Paste 1 for the Silver Paste

|  |  | Added Paste | Resistance Value (Ω) | Judgment* |
|---|---|---|---|---|
| Comparative Example 1 |  | Not added | 87,000 | Ineffective |
| Comparative Example 2 | Paste A | Ni | 88,500 | Ineffective |
| Example 1 | Paste B | W | 6,300 | Effective |
| Example 2 | Paste C | Pd | 2,200 | Very effective |
| Example 3 | Paste D | Ag/Pd alloy | 3,900 | Very effective |
| Example 4 | Paste E | Pt | 400 | Very effective |
| Comparative Example 3 | Paste F | Au | 82,000 | Ineffective |
| Example 5 | Paste G | Ru | 1,200 | Very effective |
| Example 6 | Paste H | Rh | 8,400 | Effective |
| Example 7 | Paste I | Pt-loaded graphite | 49,00- | Ineffective |
| Example 8 | Paste I (2 wt %) | Pt-loaded graphite | 24,000 | Effective |

*Judgment: A resistance value 1/20 or less the resistance value in the case of the Comparative Example 1 was judged to be "very effective", while a value of 2/3 or less the resistance value was judged to be "effective".

TABLE 4

Resistance Values and Evaluation of The p-type Electrodes Using Paste 2 for the Silver Paste

|  |  | Added Paste | Resistance Value (Ω) | Judgment* |
|---|---|---|---|---|
| Comparative Example 4 |  | Not added | 75,000 | Ineffective |
| Comparative Example 5 | Paste A | Ni | 85,000 | Ineffective |
| Example 9 | Paste B | W | 3,600 | Very effective |
| Example 10 | Paste C | Pd | 128 | Very effective |
| Example 11 | Paste D | Ag/Pd alloy | 4,200 | Effective |
| Example 12 | Paste E | Pt | 113 | Very effective |
| Comparative Example 6 | Paste F | Au | 84,000 | Ineffective |
| Example 13 | Paste G | Ru | 1,100 | Very effective |
| Example 14 | Paste H | Rh | 7,300 | Effective |

TABLE 4-continued

Resistance Values and Evaluation of The p-type Electrodes Using Paste 2 for the Silver Paste

|  |  | Added Paste | Resistance Value (Ω) | Judgment* |
|---|---|---|---|---|
| Example 15 | Paste I | Pt-loaded graphite | 9,700 | Effective |
| Example 16 | Paste I (2 wt %) | Pt-loaded graphite | 8,600 | Effective |

*Judgment: A resistance value 1/20 or less the resistance value in the case of the comparative example 4 was judged to be very effective, while that 2/3 or less the resistance value was judged to be effective.

On the basis of the above results, with the exception of nickel and gold, the addition of tungsten, palladium, silver/palladium alloy, platinum, ruthenium and rhodium to a silver paste at 1% by weight was able to lower contact resistance with $p^+$ layer. Palladium, platinum and ruthenium in particular greatly contributed to a decrease in contact resistance.

Even powders not consisting of a single component such as the silver/palladium alloy and the platinum supported by carbon particles clearly contributed to a decrease in contact resistance with $p^+$ layer. Furthermore, the reason for the degree of the contribution to decreased contact resistance being lower as compared with the case of using a single metal is thought to be because, since the powder itself was added at 1% by weight, the content of palladium or platinum in the silver paste decreased correspondingly.

A silicon oxide film referred to as a natural oxide film having a thickness of 10 to 15 Angstroms is known to normally be present on untreated silicon wafers. The pastes of the examples are believed to have fired through this silicon oxide film and make direct contact with the semiconductor surface.

What is claimed is:

1. A p-type electrode on $p^+$ layer of solar cell comprising, prior to firing;
    (a) Electrically conductive particles containing silver particle having a particle size of 0.1 to 10 microns and added particle selected from the group consisting of (i) metal particles selected from the group consisting of Mo, Tc, Ru, Rh, Pd, W, Re, Os, Ir and Pt particles,
    (b) Glass frit, and
    (c) A resin binder,
    wherein the electrode is made from a fired conductive paste which is comprised of 40 to 90 wt % of the silver particles and 0.01 to 10 wt % of the added particle based on the weight of the paste.

2. A p-type electrode of claim 1 wherein the metal particles are selected from the group consisting of Ru, Rh, Pd, W, and Pt particles.

3. A p-type electrode of claim 2 wherein the metal particles are Ru, Pd or Pt particles.

4. A p-type electrode of claim 1 wherein the electrode is made from a fired conductive paste which is comprised of 40 to 90 wt % of the silver particles and 0.1 to 5 wt % of the added particle based on the weight of the paste.

* * * * *